United States Patent
Nguyen et al.

(10) Patent No.: US 6,844,262 B1
(45) Date of Patent: Jan. 18, 2005

(54) CMP PROCESS

(75) Inventors: Tuyen V. Nguyen, Minneapolis, MN (US); Andrey V. Zagrebelny, Eagan, MN (US); Gregg E. Robinson, Eagan, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 46 days.

(21) Appl. No.: 09/944,234

(22) Filed: Aug. 31, 2001

(51) Int. Cl.⁷ .............................................. H01L 21/302
(52) U.S. Cl. ....................... 438/692; 438/694; 438/695
(58) Field of Search ................................. 438/692–695

(56) References Cited

U.S. PATENT DOCUMENTS 5,830,041 A * 11/1998 Takahashi et al. ............. 451/8
6,186,877 B1 * 2/2001 Lofaro ........................ 451/288
6,351,723 B1 * 2/2002 Maekawa .................... 702/185
6,476,921 B1 * 11/2002 Saka et al. ................... 356/630
6,484,300 B1 * 11/2002 Kim et al. ...................... 716/7

OTHER PUBLICATIONS

F. Preston, *J. Soc. Glass Tech.* (1927) 11:214–256.
*Encyclopedia of Chemical Technology*, Kirk–Othmer, vol. 14, pp. 677–709 (1995).

* cited by examiner

*Primary Examiner*—Hsien-Ming Lee
(74) *Attorney, Agent, or Firm*—Evan Law Group LLC

(57) ABSTRACT

A method of making a semiconductor structure includes determining a polish time which is sufficient to planarize a layer on a semiconductor substrate. The layer is polished for the polish time to planarize the layer, and then the layer is polished to a predetermined thickness. The semiconductor structures can be used to make a semiconductor device.

15 Claims, 1 Drawing Sheet

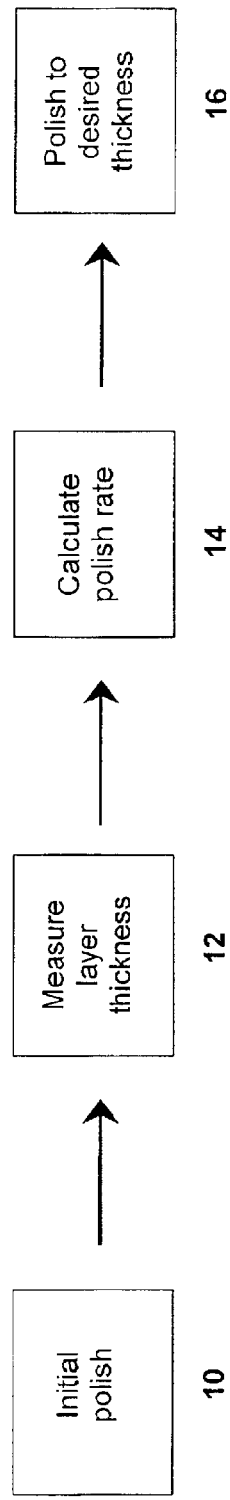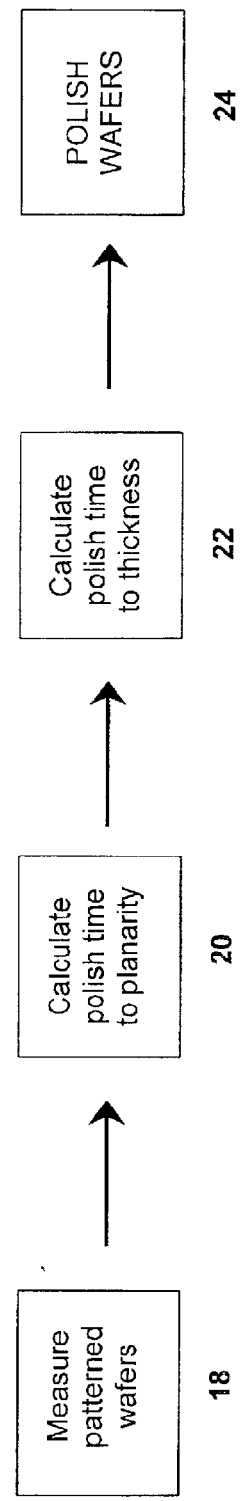

CM P PROCESS

REFERENCE TO COMPUTER PROGRAM LISTING SUBMITTED ON COMPACT DISK

A compact program listing appendix is included containing computer program code listings pursuant to 37 C.F.R. 1.52(e) and is hereby incorporated by reference. The compact disk contains program code files in visual basic format. The total number of compact disks is 1 and the files included on the compact disk are as follows:

| Creation Date | Creation Time | File Size (Bytes) | File Name |
|---|---|---|---|
| Root Directory | | | |
| 08/28/2001 | 01:12 p | 138 KB | CMP-run def.doc |

BACKGROUND

Modem ultra-large scale integrated (ULSI) circuits are constructed with up to several millions of active devices, such as transistors and capacitors, formed in a semiconductor substrate. Interconnections between the active devices are created by providing a plurality of conductive interconnection layers, such as polysilicon and metal, which are etched to form conductors for carrying signals between the various active devices. The individual interconnection layers are nominally electrically isolated from one another, and from the silicon substrate, by an insulating interlayer dielectric (ILD), such as silicon dioxide ($SiO_2$) produced by chemical vapor deposition (CVD). The conductive layers and interlayer dielectric are deposited on the silicon substrate wafer in succession, with each layer being, for example, of the order of 1 micron in thickness. The ILD conformably covers the underlying layer (e.g. a metal layer etched to form conductive interconnects) such that the upper surface of the ILD is characterized by a series of non-planar steps which correspond in height and width to the underlying interconnect lines. The dielectric layer may also be an inter-metal interlevel dielectric (IMD) between an underlying metal interconnect layer and an ensuing overlying metal interconnect layer.

Height variations in the upper surface of a dielectric can have deleterious effects on the subsequent steps and layers applied in forming the integrated circuit. For example, a non-planar dielectric surface can interfere with the optical resolution of subsequent photolithographic processing steps. This can make the high resolution lines required for compact ULSI circuits difficult to produce. Additionally, if the height variations in the dielectic surface are severe, there is a danger that insufficient metal coverage can occur at the step height variations in the subsequent conductor layer, which can result in open circuit flaws.

Chemical Mechanical Polishing (CMP) is an industry recognized process for making the upper surface of a dielectric planar (i.e. planarization). This approach employs abrasive polishing to remove the surface height variations of the dielectric layer. The semiconductor wafer is pressed against a moving polishing surface that may be wetted with a chemically reactive, abrasive slurry. The polishing pad bridges over relatively low spots on the wafer, thus removing material from the relatively high spots on the wafer. Planarization occurs because high spots on the wafer polish faster than low spots on the wafer. Thus, the relatively high portions of the wafer are smoothed to a uniform level faster than the other, relatively low portions of the wafer.

Referring to FIG. 1, the CMP process is typically a four step procedure. The wafer is first subjected to an initial polish 10 for a certain amount of time to reduce the thickness of the layer. The length of the polishing time is estimated such that the thickness does not go below a targeted value. The resulting thickness of the layer is then measured 12. Using the measured thickness and the initial polishing time, the polish rate is calculated 14. Finally, the wafer is polished again for a time that is calculated to achieve the desired final thickness, based on the polish rate 16. This procedure has a number of disadvantages, mainly due to the manual estimations and calculations that are required. Inconsistent thickness targeting can lead to poor control of the process, and unacceptable wafers must be scrapped. Different dielectric layers require different polish times, making it difficult to run CMP processes in the manufacture of more than one type of wafer, for example, wafers having a nitride dielectric and wafers having an oxide dielectric. It is also very difficult to account for other parameters which affect CMP, such as incoming dielectric thickness, pattern density, removal rate, and pad hours. Thus, it is not possible to track the overall process to determine the source of errors and the resultant scrapping of unacceptable wafers.

BRIEF SUMMARY

In a first aspect, the present invention is a method of making a semiconductor structure, comprising determining a first polish time, sufficient to planarize a layer on a semiconductor substrate; polishing the layer for said first polish time, to planarize the layer; and polishing the layer to a predetermined thickness.

In a second aspect, the present invention is a method of making a semiconductor structure, comprising determining a polish time sufficient to reduce the thickness of a layer on a semiconductor substrate to a predetermined thickness; polishing the layer such that the layer becomes planar; and polishing the layer for said polish time to reduce the thickness of the layer after planarization to the predetermined thickness.

In a third aspect, the present invention is a process for making a plurality of semiconductor structures, comprising making each semiconductor structure by any of the above methods. The Cpk of the process is at least 1.

In a fourth aspect, the present invention is a method of making a semiconductor device, comprising making a semiconductor structure by any of the above methods; and forming a semiconductor device from said structure.

In a fifth aspect, the present invention is a method of making an electronic device, comprising making a semiconductor device by any of the above methods; and forming an electronic device, comprising said semiconductor device.

In a sixth aspect, the present invention is a machine readable medium, comprising code, imbedded in the machine readable medium, for determining a first polish time, sufficient to planarize a layer on a semiconductor substrate.

In a seventh aspect, the present invention is a system for making a semiconductor structure, comprising a chemical mechanical polishing apparatus and the machine readable medium.

BRIEF DESCRIPTION OF THE DRAWINGS

FIG. 1 is a flowchart illustrating a conventional CMP process.

FIG. 2 is a flowchart illustrating an embodiment of the CMP process targeting method.

DETAILED DESCRIPTION

The present invention includes a method for controllably targeting the thickness of a layer on a silicon wafer obtained by chemical mechanical polishing (CMP). This invention makes use of the recognition that the polishing time of a layer has two primary components:

(i) the time necessary to planarize the layer, and;

(ii) the time necessary to reduce the thickness of the planarized layer.

A first polishing phase makes the layer planar, and a second polishing phase reduces the thickness of the layer. The method is preferably automated such that parameters of the wafer and of the CMP apparatus can be entered, and the thickness will then be targeted accurately. The method can be used to provide semiconductor structures.

It is believed that a patterned dielectric layer that is planar is reduced in thickness at the same rate as a smooth, unpatterned layer (blanket layer). Thus, the polish rate for a wafer having a blanket layer (blanket wafer) can be measured, and this constant rate will also apply in the polishing of a patterned layer, provided the patterned layer is planar. If the polish time necessary to make the layer planar is known or calculated, then all the polishing necessary to provide a layer with the required planarity and thickness can be carried out without the need to stop the process and measure the planarity and thickness of the wafer.

The polish rate (r) can be calculated by the following equation from F. Preston, *J. Soc. Glass Tech.*, 1927:

$$r = dA/dt = -kP(ds/dt)$$

where A is the layer thickness, t is time, P is the pressure exerted between the wafer and the pad, ds/dt is the relative velocity between the wafer surface and the pad expressed in revolutions per minute (rpm), and k is a constant that depends on factors which may include pad compressibility, slurry pH, and layer composition. For wafers which have been made planar, it can be assumed that ds/dt is constant. The above equation can be further expanded to include second order parameters, such as the tendency for the polish rate to vary from the first wafer in a lot to the last wafer in the lot.

The total polishing time is thus the sum of the time to establish planarity and the time to provide the desired thickness. The time to provide the desired thickness is calculated as the difference of the thickness once planarity is achieved and the desired final thickness, divided by the polish rate, r. The time to establish planarity is typically nonlinear and is based on measurements of the individual wafer or batch of wafers; experimentally determined for each specific pattern density, layer composition, and specific polishing system. The time to provide the desired thickness is based on a set of predetermined values specific to the type of wafer.

Referring to the flowchart in FIG. 1, the CMP process targeting method involves separate aspects of measuring and calculating. The polishing characteristics of one or more blanket wafers for a given type of wafer are measured, and constant values are derived from these measurements. These constants are entered into the algorithm which enables the calculation. For an individual patterned wafer, or for a batch of such wafers, the characteristics of the patterned wafer are measured 18, and the resultant product variables are entered into the algorithm. The polish time necessary to achieve planarity is calculated 20, as is the polish time which will subsequently provide the desired thickness 22. The wafer is then polished 24 for the calculated length of time. The calculations 20 and 22 of the polish times can be carried out in any order.

The method of CMP process targeting can include the gathering of data related to the wafer to be treated. A variety of parameters can be measured. For example, the thickness of the layer which is to be polished can be measured, as can any variations in thickness or any tilt. The pattern density can be measured by topographic analysis. The layer composition can also be identified, since the polishing behavior of the wafer may be dependent on the material characteristics of the layer. Typical dielectric layers include oxide metal 1 (an oxide layer over a first metalization layer), nitride, oxide over a local interconnect, and oxide over polycrystalline silicon. The relevant polishing processes for these layers are referred to as CMPM, CMPNIT, CMPL, and CMPP, respectively.

The method of CMP process targeting can further include the gathering of data related to the apparatus which is used to carry out the CMP process. These parameters include, for example, the type of polishing pad, the number of polishes for which the pad has been used, the composition of the polishing slurry, and the removal rate made possible by the apparatus. Different apparatus can be used by this method if the unique characteristics of the various machines are used. Examples of CMP apparatus include WESTECH 372/472, AURIGA polishers available from SPEEDFAM-IPEC, INC. (Phoenix, Ariz.), MIRRA available from APPLIED MATERIALS, INC. (Santa Clara, Calif.), and LAM TERES, available from LAM RESEARCH CORPORATION (Fremont, Calif.).

The data that is gathered can then be used to calculate polishing times with the target of achieving a thickness and planarity of the dielectric layer which is within an acceptable range, or window. The calculations yield an initial polishing time which is sufficient to planarize the layer, and a second polishing time which reduces the thickness of the layer while maintaining the planarity.

The reproducibility of the thickness and planarity values which can be provided by the CMP process targeting method are measured in terms of Cpk. The Cpk number is a statistical measure of performance widely used in the semiconductor industry and is defined as:

$$Cpk = \text{minimum} \left[ (Xbar - LSL)/3\sigma; (USL - Xbar)/3\sigma \right]$$

where LSL and USL are the lower and upper specification limits (tolerances); Xbar is the calculated average of nominal values for all data points used for Cpk evaluation; and σ is the standard deviation of the data points. A Cpk value of 1 means that each product is produced with measurements within a 95% confidence of the process tolerances. A process having a Cpk=1 is referred to as "capable." It is desirable for a process to have a Cpk value greater than 1, meaning that the product measurements are within a confidence greater than 95%. A process with a Cpk less than 1 is considered "risky" since there is no guarantee the product will be close to the desired tolerances. The CMP process targeting method, when applied to a standard CMP procedure, can increase Cpk by 20–25%. This increase in accuracy can result in a reduction in scrap of 5–10%. These improvements apply not only to wafers with oxide layers, but also to wafers with nitride layers.

The present invention includes a computer program on a machine readable medium capable of carrying out the calculations. A machine readable medium refers to a medium which can be read by a machine, such as a computer. Examples of machine readable media include magnetic memory, such as a hard disk or a floppy disk; optical memory such as a CD-ROM; imbedded memory such as ROM or RAM; and punch cards. The computer program contains code, which refers to an instruction set, read by a machine such as a computer, which provides instructions to the machine.

The present invention includes a CMP processing system containing a CMP apparatus, and code on a machine readable medium capable of controlling the CMP process. The system may further include an analyzer which measures the parameters of the patterned wafer and automatically enters those values into the calculations as performed by the computer program. The construction and use of such a system, including the code, is within the abilities of one ordinarily skilled in the art.

The method provides for modification and updating as needed. For example, the apparatus parameters may need to be changed as a CMP apparatus ages or if the apparatus is replaced. Also, variations in the quality of the incoming wafer may occur over time, resulting in different constant values.

The related processing steps, including etching and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

What is claimed is:

1. A method of making a semiconductor structure, comprising:

measuring a pattern density of a layer; followed by calculating a first polish time, sufficient to planarize the layer on a semiconductor substrate;

polishing the layer for said first polish time, to planarize the layer; and polishing the layer to a predetermined thickness.

2. The method of claim 1, further comprising, prior to the calculating of said first polish time, measuring the thickness of the layer.

3. The method of claim 1, further comprising, prior to the calculating of said first polish time, identifying a composition of the layer.

4. The method of claim 1, further comprising determining a second polish time sufficient to reduce the thickness of the layer after planarization to the predetermined thickness;

wherein the polishing of the layer to the predetermined thickness comprises polishing the layer for said second polish time.

5. A process for making a plurality of semiconductor structures, comprising:

making each semiconductor structure by the method of claim 4;

wherein a Cpk of the process is at least 1.

6. The process of claim 5, wherein the making of each semiconductor structure comprises, prior to the calculating of said first polish time, measuring the thickness of the layer, a pattern density of the layer, and identifying a composition of the layer.

7. A method of making a semiconductor device, comprising:

making a semiconductor structure by the method of claim 4; and forming a semiconductor device from said structure.

8. A method of making an electronic device, comprising:

making a semiconductor device by the method of claim 7, and forming an electronic device, comprising said semiconductor device.

9. A process for making a plurality of semiconductor structures, comprising making each semiconductor structure by the method of claim 1;

wherein a Cpk of the process is at least 1.

10. A method of making a semiconductor device, comprising:

making a semiconductor structure by the method of claim 1; and forming a semiconductor device from said structure.

11. A method of making an electronic device, comprising:

making a semiconductor device by the method of claim 10, and forming an electronic device, comprising said semiconductor device.

12. In a method of making a semiconductor structure, including polishing a layer by chemical mechanical polishing, the improvement comprising measuring a pattern density of the layer; followed by calculating a first polish time sufficient to make the layer planar; determining a second polish time to reduce the thickness of the planar layer; and polishing for a third polish time equal to the sum of the first and second polish times.

13. A method of making a semiconductor structure, comprising:

measuring the pattern density of a layer on a semiconductor substrate and followed by polishing the layer with a system comprising:

a chemical mechanical polishing apparatus; and machine readable medium, comprising code, imbedded in the machine readable medium, for calculating a first polish time, sufficient to planarize a layer on a semiconductor substrate.

14. A method of making a semiconductor device, comprising:

making a semiconductor structure by the method of claim 13, and forming a semiconductor device from said structure.

15. A method of making an electronic device, comprising:

making a semiconductor device by the method of claim 14; and forming an electronic device, comprising said semiconductor device.

* * * * *

UNITED STATES PATENT AND TRADEMARK OFFICE
CERTIFICATE OF CORRECTION

PATENT NO. : 6,844,262 B1
DATED : January 18, 2005
INVENTOR(S) : Tuyen V. Nguyen, Andrey V. Zagrebelny and Gregg E. Robinson It is certified that error appears in the above-identified patent and that said Letters Patent is hereby corrected as shown below:

Column 6,
Line 47, delete "and".

Signed and Sealed this

Seventh Day of March, 2006

JON W. DUDAS
*Director of the United States Patent and Trademark Office*